United States Patent
Tian et al.

(10) Patent No.: US 11,863,202 B2
(45) Date of Patent: *Jan. 2, 2024

(54) POLAR CODING AND DECODING FOR CORRECTING DELETION AND/OR INSERTION ERRORS

(71) Applicant: The Regents of the University of California, Oakland, CA (US)

(72) Inventors: Kuangda Tian, La Jolla, CA (US); Arman Fazeli Chaghooshi, La Jolla, CA (US); Alexander Vardy, La Jolla, CA (US)

(73) Assignee: The Regents of the University of California, Oakland, CA (US)

( * ) Notice: Subject to any disclaimer, the term of this patent is extended or adjusted under 35 U.S.C. 154(b) by 48 days.

This patent is subject to a terminal disclaimer.

(21) Appl. No.: 17/383,348

(22) Filed: Jul. 22, 2021

(65) Prior Publication Data
US 2021/0351794 A1 Nov. 11, 2021

Related U.S. Application Data

(63) Continuation of application No. 16/503,446, filed on Jul. 3, 2019, now Pat. No. 11,108,413.
(Continued)

(51) Int. Cl.
*H03M 13/15* (2006.01)
*H03M 13/45* (2006.01)

(52) U.S. Cl.
CPC ..... *H03M 13/1575* (2013.01); *H03M 13/458* (2013.01)

(58) Field of Classification Search
CPC ........... H03M 13/1575; H03M 13/458; H03M 13/373; H03M 13/6337; H03M 13/13
(Continued)

(56) References Cited

U.S. PATENT DOCUMENTS

| 9,176,927 B2 | 11/2015 | Gross et al. |
| 2014/0108748 A1* | 4/2014 | Lee ................ H03M 13/6362 711/154 |

(Continued)

OTHER PUBLICATIONS

Abbe, E. et al., MAC polar codes and matroids, in Proc. Information Theory and Applications Workshop, La Jolla, CA, Feb. 2010. 8 pages.
(Continued)

*Primary Examiner* — James C Kerveros
(74) *Attorney, Agent, or Firm* — Perkins Coie LLP

(57) ABSTRACT

Disclosed are devices, systems and methods for polar coding and decoding for correcting deletion and insertion errors caused by a communication channel. One exemplary method for error correction includes receiving a portion of a block of polar-coded symbols that includes $d \geq 2$ insertion or deletion symbol errors, the block comprising N symbols, the received portion of the block comprising M symbols; estimating, based on one or more recursive calculations in a successive cancellation decoder (SCD), a location or a value corresponding to each of the d errors; and decoding, based on estimated locations or values, the portion of the block of polar-coded symbols to generate an estimate of information bits that correspond to the block of polar-coded symbols, wherein the SCD comprises at least $\log_2(N)+1$ layers, each comprising up to $d^2 N$ processing nodes arranged as N groups, each of the N groups comprising up to $d^2$ processing nodes.

20 Claims, 10 Drawing Sheets

Related U.S. Application Data

(60) Provisional application No. 62/740,878, filed on Oct. 3, 2018.

(58) Field of Classification Search
USPC .......................................................... 714/776
See application file for complete search history.

(56) References Cited

U.S. PATENT DOCUMENTS

| | | | |
|---|---|---|---|
| 2017/0353267 A1* | 12/2017 | Kudekar | H04L 1/0041 |
| 2019/0052418 A1* | 2/2019 | Li | H04L 1/203 |
| 2019/0132011 A1* | 5/2019 | Chandesris | H03M 13/458 |
| 2020/0076535 A1* | 3/2020 | Xu | H03M 13/2906 |

OTHER PUBLICATIONS

Abbe, E. et al., Polar codes for the m-user multiple access channel, IEEE Trans. Inform. Theory, vol. 58, No. 8, pp. 5437-5448, Aug. 2012.
Andersson, M. et al., Nested polar codes for wiretap and relay channels, IEEE Comm. Letters, vol. 14, pp. 752-754, 2010.
Arikan, E., Channel polarization: A method for constructing capacity-achieving codes for symmetric binary-input memoryless channels, IEEE Transactions on Information Theory, vol. 55, No. 7, pp. 3051-3073, 2009.
Arikan, E., Source polarization, in Proc. IEEE Intern. Symp. Information Theory, pp. 899-903, Austin, TX, Jun. 2010.
Baumert, L., et al., "Symbol synchronization in convolutionally coded systems (corresp.)," IEEE Transactions on Information Theory, vol. 25, No. 3, pp. 362-365, May 1979.
Bouloutas, A., et al., "Two extensions of the viterbi algorithm," IEEE Transactions on Information Theory, vol. 37, No. 2, pp. 430-436, Mar. 1991.
Brakensiek, J., et al., "Efficient low-redundancy codes for correcting multiple deletions," IEEE Transactions on Information Theory, No. 64, vol. 5, pp. 3403-3410, May 2018.
Brink, B. et al., Pruned convolutional codes for flexible unequal error protection against insertion/deletion/reversal errors, International Symposium on Information Theory, pp. 260, 2000.
Bukh, B., et al., "An improved bound on the fraction of correctable deletions," IEEE Trasnactions on Information Theory, No. 63, vol. 1, pp. 93-103, Jan. 2017.
Burshtein, D., et al., Polar write once memory codes, IEEE Trans. Inform. Theory, vol. 59, No. 8, pp. 3498-3508, Aug. 2013.
Cheng, L. et al., Bidirectional Viterbi decoding using the Levenshtein distance metric for deletion channels, Information Theory Workâ-shop, pp. 254-258, 2006.
Chen, J. et al., Concatenated codes for deletion channels, IEEE International Symposium on Information Theory, pp. 218-218, 2003.
Cheraghchi, M. "Capacity upper bounds for deletion-type channels," in Proceedings of the 50th ACM Symposium on Theory of Computing (STOC 2018), 2018.
Cronie, H.S., et al., Lossless source coding with polar codes, in Proc. IEEE Intern. Symp. Information Theory, pp. 904-908, Austin, TX, Jun. 2010.
Davey, M.C. et al., Reliable communication over channels with insertions, deletions, and substitutions, IEEE Transactions on Information Theory, vol. 47, No. 2, pp. 687-698, 2001.
Diggavi, S. et al., On information transmission over a finite buffer channel, IEEE Transactions on Information Theory, vol. 52, No. 3, pp. 1226-1237, Mar. 2006.
Gallager, R. Sequential decoding for binary channels with noise and synchronization errors, Lincoln Lab. Group Report, Oct. 1961.
Goela, N. et al., Polar codes for broadcast channels, IEEE Trans. Inform. Theory, vol. 61, No. 2, pp. 758-782, Feb. 2015.
Guruswami, V., et al., "Efficiently decodable codes for the binary deletion channel," arXiv preprint arXiv: 1705.01963, 2017.
Guruswami, V., et al., Coding against deletions in oblivious and online models, ACM-SIAM Symposium on Discrete Algorithms, pp. 625-643, 2018.
Guruswami, V. et al., "Deletion codes in the high-noise and high-rate regimes," IEEE Transactions on Information Theory, vol. 63, No. 4, pp. 1961-1970, Apr. 2017.
Hanna, S.K. et al., Guess & Check Codes for Deletions and Synchronization, arXiv preprint arXiv: 1702.04466, 2017.
Hassani, S.H. et al., "Finite-length scaling for polar codes," IEEE Transactions ofInformation Theory, vol. 60, No. 10, pp. 5875-5898, 2014.
Haeupler, B., et al., "Synchronization Strings: Explicit Constructions, Local Decoding, and Applications," in Proceedings of the 50th ACM Symposium on Theory of Computing (STOC), arXiv: 1710. 09795, 2018.
Haeupler, B., et al., "Synchronization Strings: Codes for Insertions and Deletions Approaching the Singleton Bound," in Proceedings of the 49th ACM Symposium on Theory of Computing (STOC), arXiv:1704.00807, 2017.
Haeupler, B., et al., "Synchronization Strings: List Decoding for Insertions and Deletions," in Proceedings of International ColloÂ-quium on Automata, Languages and Prograninning (ICALP), arXiv: 1802.08663, 2018.
Haeupler, B., et al., "Synchronization Strings: Channel Simulations and Interactive Coding for Insertions and Deletions," in Proceedings of International Colloquium on Automata, Languages and Prograninning (ICALP), arXiv:1707.04233, 2018.
Helberg, A.S.J. et al., On multiple insertion/deletion correcting codes, IEEE Transactions on Information Theory 48, vol. 48, No. 1, pp. 305-308, Jan. 2002.
Hof, E., et al., Secrecy-achieving polar-coding, Proc. IEEE Information Theory Workshop, Dublin, Ireland, Aug. 2010.
Iwamura, K., et al., "A code to correct synchronization errors," Electronics and Communications in Japan (Part III: Fundamental Electronic Science), vol. 76, No. 6, pp. 60-71, Jan. 1993.
Iizuka, I., et al., "Block codes capable of correcting both additive and timing errors," IEEE Transactions on Information Theory, vol. 2nd timing errors, IEEE Transactions on Information Theory, vol. 26, No. 4, pp. 393-400, Jul. 1980.
Korada, S.B., et al., Polar codes are optimal for lossy source coding, IEEE Trans. Inform. Theory, vol. 56, No. 4, pp. 1751-1768, Apr. 2010.
Korada, S.B., et al., Polar codes for Slepian-Wolf, Wyner-Ziv, and Gelfand-Pinsker, Proc. IEEE Information Theory Workshop, Cairo, Egypt, Jan. 2010.
Koyluoglu, 0 .0. et al., Polar coding for secure transmission and key agreement, IEEE Trans. Inform. Forensics and Security, vol. 7, No. 5, pp. 1472-1483, Jul. 2012.
Levenshtein, V.I. Binary codes capable of correcting deletions, insertions, and reversals, Soviet physics doklady, vol. 10, No. 8, 1966.
Mahdavifar, H. et al., "Polar coding for bit-interleaved coded modulation," IEEE Transactions on Vehicular Technology, vol. 65, np. 5, pp. 3115-3127, May 2016.
Mahdavifar, H. et al., Achieving the uniform rate region of general multiple access channels by polar coding, IEEE Trans. on Communications, vol. 64, No. 2, pp. 467-478, 2016.
Mahdavifar, H. et al., Achieving the secrecy capacity of wiretap channels using polar codes, IEEE Trans. Inform. Theory, vol. 57, No. 10, pp. 6428-6443, Oct. 2011.
Mansour, M.F. et al., "Convolutional decoding in the presence of synchronization errors," IEEE Journal on Selected Areas in Communications, vol. 28, No. 2, pp. 218-227, Feb. 2010.
Mercier, H. et al., A survey of error-correcting codes for channels with symbol synchronization errors, IEEE Communications Surveys & Tutorials, vol. 12, No. 1, pp. 87-96, 2010.
Mitzenmacher, M. "Polynomial time low-density parity-check codes with rates very close to the capacity of the q-ary random deletion channel for large q," IEEE Transactions on Information Theory, vol. 52, No. 12, pp. 5496-5501, Dec. 2006.
Mitzenmacher, M. A survey of results for deletion channels and related synchronization channels, Probability Surveys, vol. 6, pp. 1-33, 2009.

(56) References Cited

OTHER PUBLICATIONS

Mondelli, M., et al., Achieving Marton's region for broadcast channels using polar codes, IEEE Trans. Inform. Theory, vol. 61, No. 2, pp. 783-800, Feb. 2015.
Dos Santos, M.P.F. et al., Correction of insertions/deletions using standard convolutional codes and the Viterbi decoding algorithm, Information Theory Workshop, pp. 187-190, 2003.
Saowapa, K. et al., Systematic binary deletion/insertion error correcting codes capable of correcting random bit errors, IEICE Transactions on Fundamentals of Electronics, Communications and Computer Sciences, vol. 83, No. 12, pp. 2699-2705, 2000.
Sasoglu, E., et al., Polar codes for the two-user multiple-access channel, arXiv: 1006.4255, preprint of Jun. 22, 2010. 12 pages.
Sasoglu, E. Polar coding theorems for discrete systems, Ecole Polytechnique Federale de Lausanne, 2011.
Sasoglu, E., et al., A new polar coding scheme for strong security on wiretap channels, in Proc. IEEE Intern. Symp. Information Theory, pp. 1117-1121, Istanbul, Turkey, Jul. 2013.
Sasoglu, E. et al., Polar coding for processes with memory, IEEE International Symposium on Information Theory, pp. 225-229, 2016.
Shuval, B. et al., Fast polarization for processes with memory, arXiv preprint arXiv:1710.02849, 2017.
Sloane, N.J.A. "On single-deletion-correcting codes," Codes and designs, vol. 10, pp. 273-291, May 2002.
Tal, I. et al. "How to construct polar codes," IEEE Transactions on Information Theory, vol. 69, No. 10, pp. 6562-6582, 2013.
Tal, I. et al. "List decoding of polar codes," IEEE Transactions on Information Theory, vol. 61, No. 5, pp. 2213-2226, 2015.
Swart, T.G. et al., A note on double insertion/deletion correcting codes, IEEE Transactions on Information Theory, vol. 49, No. 1, pp. 269-273, Jan. 2003.
Thomas, E.K. et al., Polar Coding for the Binary Erasure Channel With Deletions, IEEE Communications Letters 21, No. 4, pp. 710-713, 2017.
Tian, K. et al., Polar Codes for Channels with Deletions, Proceedings of 55th Annual Allerton Conference on Communication, Control, and Computing, Oct. 2017.
Ullman, J. "Near-optimal, single-synchronization-error-correcting code," IEEE Transactions on Information Theory, vol. 12, No. 4, pp. 418-412, Oct. 1966.
Varshamov, R. et al., Codes with correct single asynunetric errors, Automation and Remote Control, vol. 26, No. 2, pp. 286-290, 1965.
Wachter-Zeh, A. "List decoding of insertions and deletions," IEEE Transactions on Information Theory (Early Access), Nov. 2017.

* cited by examiner

| Scenarios | $d_2$ | $d_1$ | Received symbols corresponding to $x_a^b$ |
|---|---|---|---|
| 1 | 0 | 0 | $y_a^b$ |
| 2 | 0 | 1 | $y_{a-1}^{b-1}$ |
| ⋮ | ⋮ | ⋮ | ⋮ |
| $d+1$ | 0 | $d$ | $y_{a-d}^{b-d}$ |
| $d+2$ | 1 | 0 | $y_a^{b-1}$ |
| $d+3$ | 1 | 1 | $y_{a-1}^{b-2}$ |
| ⋮ | ⋮ | ⋮ | ⋮ |
| $2d+1$ | 1 | $d-1$ | $y_{a-d+1}^{b-d}$ |
| $2d+2$ | 2 | 0 | $y_a^{b-2}$ |
| ⋮ | ⋮ | ⋮ | ⋮ |
| $d(d+3)/2 - 1$ | $d-1$ | 0 | $y_a^{b-d+1}$ |
| $d(d+3)/2$ | $d-1$ | 1 | $y_{a-1}^{b-d}$ |
| $(d+1)(d+2)/2$ | $d$ | 0 | $y_a^{b-d}$ |

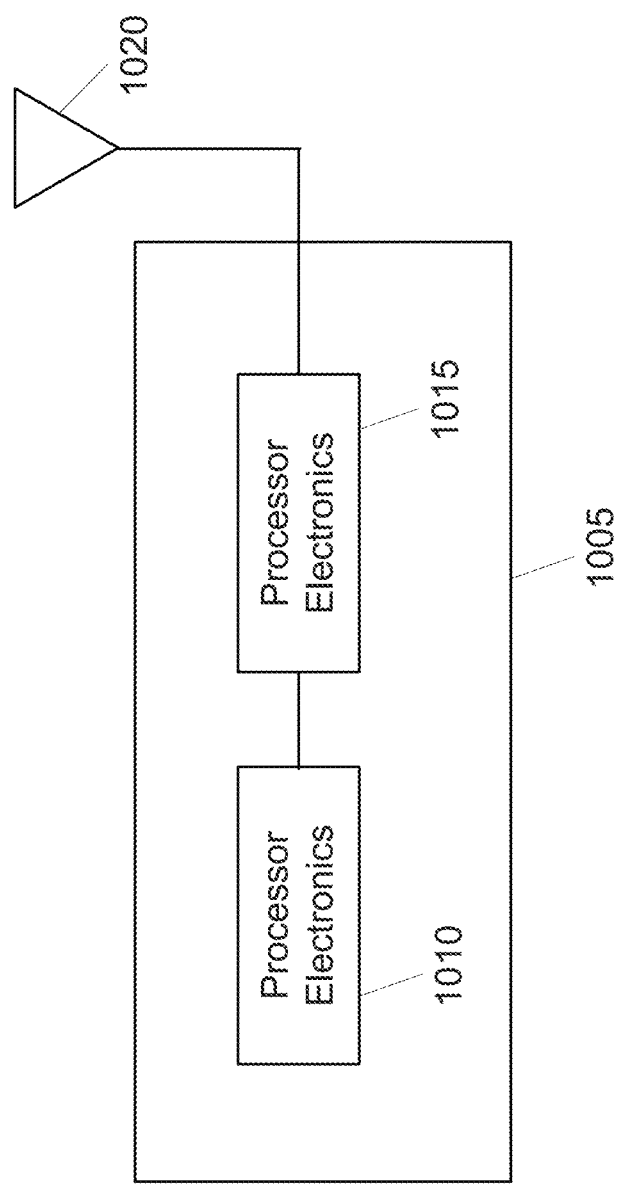

US 11,863,202 B2

POLAR CODING AND DECODING FOR CORRECTING DELETION AND/OR INSERTION ERRORS

CROSS-REFERENCE TO RELATED APPLICATION

This patent document is a continuation of U.S. patent application Ser. No. 16/503,446 entitled "POLAR CODING AND DECODING FOR CORRECTING DELETION AND/OR INSERTION ERRORS", filed on Jul. 3, 2019 which claims priority to and benefits of U.S. Provisional Patent Application No. 62/740,878 entitled "POLAR CODING AND DECODING FOR CORRECTING DELETION AND/OR INSERTION ERRORS" and filed on 3 Oct. 2018. The entire contents of the before-mentioned patent applications are incorporated by reference as part of the disclosure of this patent document.

TECHNICAL FIELD

This document generally relates to error correction codes, and more particularly to polar codes for deletion channels.

BACKGROUND

A communications system generally adopts channel encoding to improve reliability of data transmission and ensure quality of communications in the presence of various types of noise and errors. While many forward error correction (FEC) codes have been proposed to combat noise and channel fading, there is a glaring lack of good/practical coding schemes for correcting symbol deletion and/or insertion errors, which typically result in synchronization errors in the communication system.

SUMMARY

Embodiments of the disclosed technology relate to polar coding and decoding methodologies and devices that can effectively and efficiently correct deletions and insertions, thereby improving the communication system's resiliency to synchronization errors. The receiver structure and processing described in the present document advantageously enable the use of polar codes to correct deletions and insertions, in addition to their inherent properties to mitigate other channel impairments such as noise, etc.

The present document provides methods, devices and systems for polar coding and decoding for correction insertion and/or deletion errors. An exemplary method for error correction includes receiving a portion of a block of polar-coded symbols that includes d insertion or deletion symbol errors, the block comprising N symbols, the received portion of the block comprising M symbols, and wherein d≥2, M and N are integers; estimating, based on one or more recursive calculations in a successive cancellation decoder, a location or a value corresponding to each of the d insertion or deletion symbol errors; and decoding, based on estimated locations or values, the portion of the block of polar-coded symbols to generate an estimate of information bits that correspond to the block of polar-coded symbols, wherein the successive cancellation decoder comprises at least $\log_2(N)+1$ layers, each layer comprising up to $d^2 N$ processing nodes arranged as N groups, each of the N groups comprising up to $d^2$ processing nodes, wherein a complexity of estimating the location or the value scales polynomially with d, wherein at least one bit of the information bits has a known value at the data processing system prior to receiving the portion of the block of polar-coded symbols, and wherein the d insertion or deletion symbol errors comprise (a) two or more deleted symbols, (b) two or more inserted symbols, or (c) at least one deleted symbol and at least one inserted symbol.

Another exemplary method for error correction includes receiving a portion of a block of symbols that includes a plurality of errors, the symbols corresponding to information bits encoded using a polar code, the plurality of errors comprising (a) two or more deleted symbols, (b) two or more inserted symbols, or (c) at least one deleted symbol and at least one inserted symbol, wherein the block comprises N symbols and the received portion of the block comprises M symbols, and wherein M and N are integers; and using the received portion of the block of symbols to perform successive cancellation decoding to generate an estimate of the information bits corresponding to the block of symbols, wherein at least one bit of the information bits has a known value at the data processing system prior to receiving the portion of the block of polar-coded symbols, and wherein a complexity of generating the estimate scales polynomially with a number of the plurality of errors and a number of symbols in the block (N).

BRIEF DESCRIPTION OF THE DRAWINGS

FIG. 10 is a block diagram representation of a portion of an apparatus, in accordance with some embodiments of the presently disclosed technology.

DETAILED DESCRIPTION

Polar codes are a new approach to maximizing the rate and reliability of data transmissions. In an example, polar codes have been adopted to improve coding performance for control channels in 5G. At the same time, they reduce the complexity of design and ensure service quality. Polar codes are a type of linear block error correcting code, whose code construction is based on a multiple recursive concatenation of a short kernel code which transforms the physical channel into virtual outer channels. When the number of recursive concatenations becomes large, the virtual channels tend to either have very high reliability or very low reliability (in other words, they polarize), and the data bits are allocated to the most reliable channels. Prior to the technology described herein, polar codes were never considered to be capable of efficiently correcting synchronization errors (such as deletion and/or insertion errors).

Section headings are used in the present document to improve readability of the description and do not in any way limit the discussion or embodiments (and/or implementations) to the respective sections only.

Furthermore, the present document uses examples from the 3 GPP New Radio (NR) network architecture and 5G protocol only to facilitate understanding and the disclosed techniques and embodiments may be practiced in other communication systems that use different communication protocols.

Symbol deletion. In the present document, n denotes the code-length and d denotes the number of deletions. In some embodiments, the number of deletions d could be a constant, a function of the code-length, or a random number generated from a binomial distribution.

In some embodiments, locations of the deleted symbols could be selected uniformly at random. Alternatively, they could be selected according to another probability distribution ($\mathcal{D}_{n,d}$) over all $$\binom{n}{d}$$

possible scenarios. The transmitted symbols are denoted by $X_1^n \in \{0,1\}^n$, while $Y_1^n \in \mathcal{Y}^n$ correspond to the received symbols prior to the deletion effect. The final n−d symbols are denoted as $\tilde{Y}_1^{n-d} \in \mathcal{Y}^{n-d}$, wherein the d randomly chosen symbols go through a deletion transformation (e.g., from the symbol $x_i$ to the empty word/symbol).

Figure 1A:
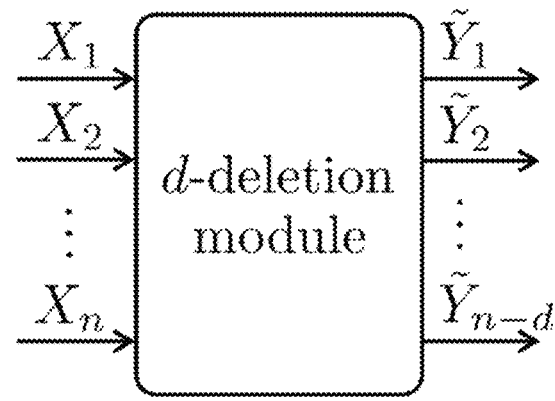
FIG. 1A illustrates an example of a d-deletion channel.
Figure 1B:
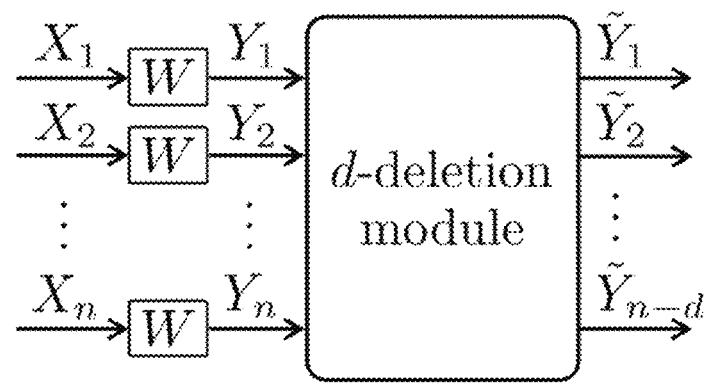
FIG. 1B illustrates an example of a noisy d-deletion channel.

Channel models. Embodiments and examples in the present document are described in the context of the noiseless deletion channel, but are equally applicable to general noisy channels with deletions. The noisy d-deletion can be considered as the cascade between binary-input discrete memoryless channel (B-DMC) and d-deletion channel. There is no commonly known channel model for the noisy d-deletion channel. However, since the synchronization problems often happen at the receiver and after the noise effect of the wireless channel, the DMC is placed prior to the d-deletion channel. FIGS. 1A and 1B illustrate the noiseless and noisy deletion channels as described above, respectively.

In addition to the d-deletion channel, embodiments of the disclosed technology are equally applicable to an insertion channel, which adds a symbol with a predefined probability, and is similarly characterized.

Polar codes. In the present document, embodiments of the disclosed technology use a (n, k) polar encoder, where $n=2^m$ corresponds to m levels of polarization and k denotes the number of information bits in the polar code, resulting in n−k frozen bits. In some embodiments, the frozen bits are set to zero. In other embodiments, the frozen bits are computed such that they are known a priori at both the transmitter and the receiver. The relationship between the transmitted symbols $\{x_i\}$ and the uncoded information bits $\{u_i\}$ is given by:

$$x = uG_n, \quad G_n = B_n \begin{bmatrix} 1 & 0 \\ 1 & 1 \end{bmatrix}^{\otimes m}.$$

Herein, $G_n$ is the polar code generator (or generating) matrix. In some embodiments, the polar code generator matrix is the m-th Kronecker power of the 2×2 kernel matrix that is multiplied by a length-n bit reversal matrix $B_n$ and u denotes the uncoded information bit vector that includes k information bits and n−k frozen bits. In an example, the 2×2 kernel matrix (denoted F) and the m-th Kronecker power of the kernel matrix for m=3 are given by:

$$F = \begin{bmatrix} 1 & 0 \\ 1 & 1 \end{bmatrix}, \text{ and } F^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}.$$

In some embodiments, different 2×2 kernel matrices $$\left(\text{e.g., } \begin{bmatrix} 1 & 1 \\ 1 & 0 \end{bmatrix}\right)$$

may be used to generate the polar code. In other embodiments, the bit reversal matrix $B_n$ may be omitted in the generation of the polar code.

Successive cancellation decoding. In some embodiments, a receiver (illustrated in FIG. 2) includes a front-end 210, a demodulator 220 and a polar code decoder 230, which implements successive cancellation decoding. In an example, successive cancellation decoding starts by using the symbols received over the channel to decode a first bit, and then subsequent bits are decoded based on the symbols received over the channel and one or more previously decoded bits. For example, a tenth bit is decoded as a function of the symbols received over the channel and the values determined (e.g., "0" or "1") for at least one of the nine previous bits that have already been decoded.

In some embodiments, successive cancellation decoding comprises decoding $u_i$ for i=1, 2, . . . , n sequentially while assuming the values of the previous $u_i$'s. In other words, to decode $u_i$, it is assumed that the previous bits $u_j, \ldots, u_{i-1}$, are all known (or correctly decoded) and hence available to the decoder similar to the channel observation vector after deletions $\tilde{y}$.

Figure 3:
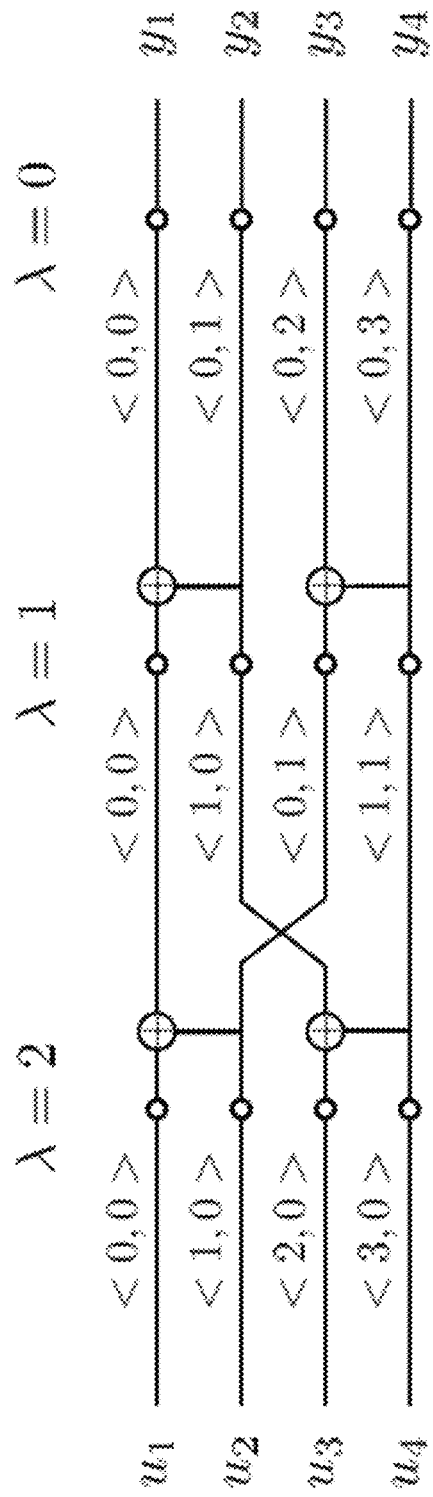
FIG. 3 illustrates an example of an encoder polar graph for a code-length (n) of 4.

For example, $u_1$ is determined based on the channel observation vector after deletions $\tilde{y}$, whereas $u_2$ is determined based on $\tilde{y}$ and the value of $u_1$ (e.g., the value of $u_1$ determines whether a function at a node in FIG. 3 implements a multiplication or a division). The process continues with the decoding of $u_i$ being based on $\tilde{y}$ and the previous bits $u_1, \ldots, u_{i-1}$ (e.g., decoding $u_5$ requires $\tilde{y}$ and at least one of $\{u_1, u_2, u_3, u_4\}$). Additional details regarding successive cancellation decoding of polar codes may be found in U.S.

Pat. No. 9,176,927, which is hereby incorporated by reference, in its entirety, as part of this application.

SC decoding in deletion channels. In some embodiments, the construction of the polar code generator matrix based on Kronecker products allows its encoding circuit to be realized over a FFT-like graph that is sometimes referred to as the Tanner graph of polar codes, or more commonly as just the polar computation graph. The butterfly structure of this graph allows the encoding algorithm to be realized with $\mathcal{O}(n \log n)$ computational complexity. Moreover, the very same graph can be used in decoder to successively estimate $u_i$'s again with $\mathcal{O}(n \log n)$ computational complexity. FIG. 3 depicts the graph of a length-4 polar code (with m=2, n=4). The polar computation graph has m+1 layers that correspond tom steps of the polarization. Each layer also has n nodes in it. These nodes are labeled with $\langle \varphi, \beta \rangle_\lambda$, where $\varphi$ denotes their phase number, $\beta$ denotes their branch number and $\lambda$ denotes the layer number. In FIG. 3, the bit reversal permutation (e.g., the effect of the matrix $B_n$) is absorbed in between the layers, and for nodes within layer $\lambda$, it is assumed:

$$0 \leq \varphi \leq 2^\lambda \text{ and } 0 \leq \beta < 2^{m-\lambda}.$$

In some embodiments, the decoding polar codes based on successive cancellation decoding uses two data structures, denoted B, which stores a binary value $\in \{0,1\}$ for each node in the polar computation graph that corresponds to its hard value, and P, which stores the probabilities (or the likelihoods) of each node being equal to 0 or 1 given the received vector y. The structure of the polar computation graph enables the efficient calculation of these values in a recursive fashion.

In the decoding of a polar code, embodiments of the disclosed technology do not fix a deletion pattern from the beginning of the decoding process, but rather, limit the deletion pattern gradually during the recursive process of the successive cancellation decoder.

Figure 4:
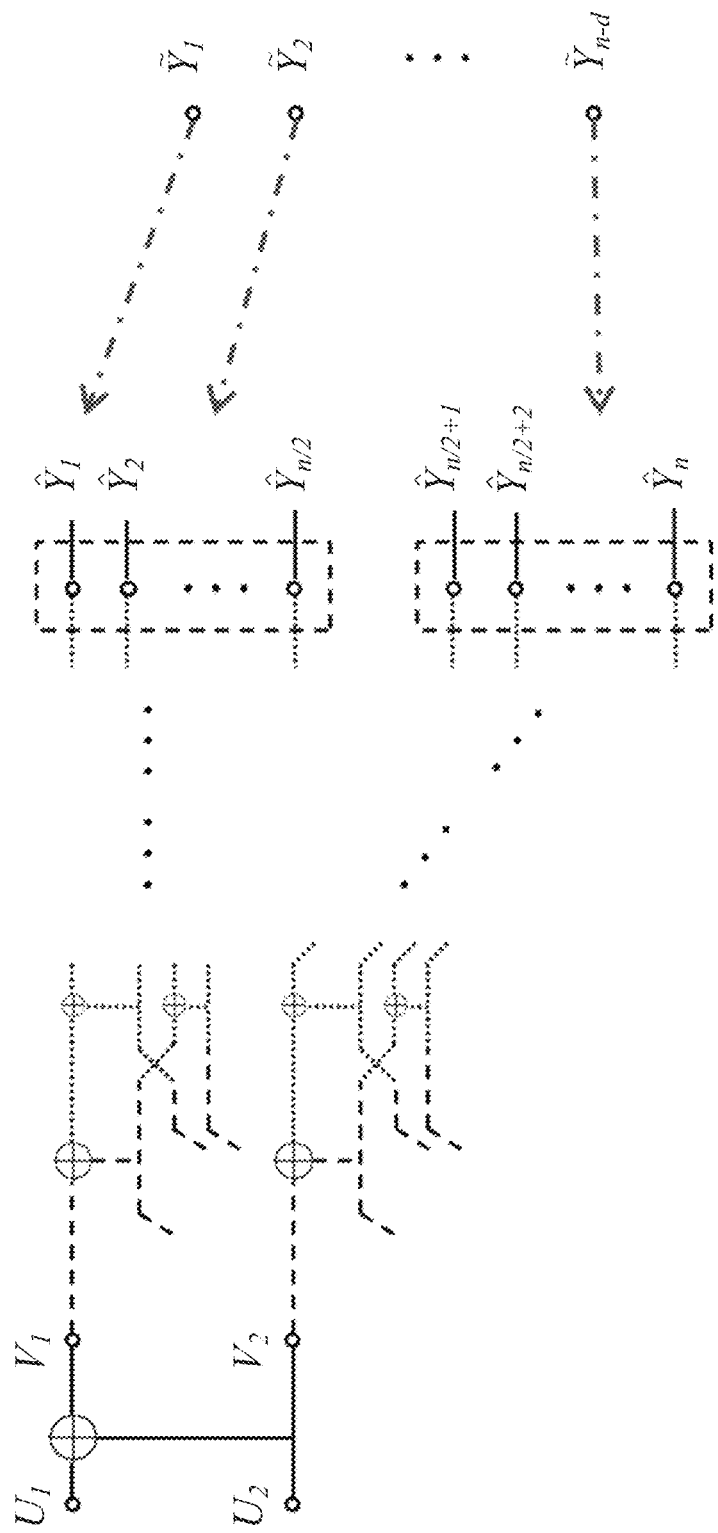
FIG. 4 illustrates an example of a successive cancellation (SC) recursion, in accordance with some embodiments of the presently disclosed technology.

In an example, the first step of this process is elucidated in the context of FIG. 4, and includes an attempt at decoding the first information bit, $u_1$. This is based on the evaluation of two intermediate bit-channels in layer $\lambda=m-1$ that are labeled with $\langle \varphi, \beta \rangle = \langle 0, 0 \rangle$ and $\langle 0, 1 \rangle$ (e.g., nodes $V_1$ and $V_2$ on the polar computation graph illustrated in FIG. 4). These two bit-channels are independent and are looking at two disjoint sub-vectors of length-(n/2) from $\hat{y}_i$'s as the output, where the $\hat{y}_i$'s are the reconstructed vector of received symbols in which the deleted symbols are treated as erasures. However, in presence of deletions, it is unclear which of the $\tilde{y}_i$ symbols should be mapped to the top half, and which belong to the bottom half. Instead of distinguishing between all different $$\binom{n}{d}$$

deletion patterns at this stage, the number of deletions that belong to each half is decided, and further calculations are postponed till a later stage.

Figure 5:
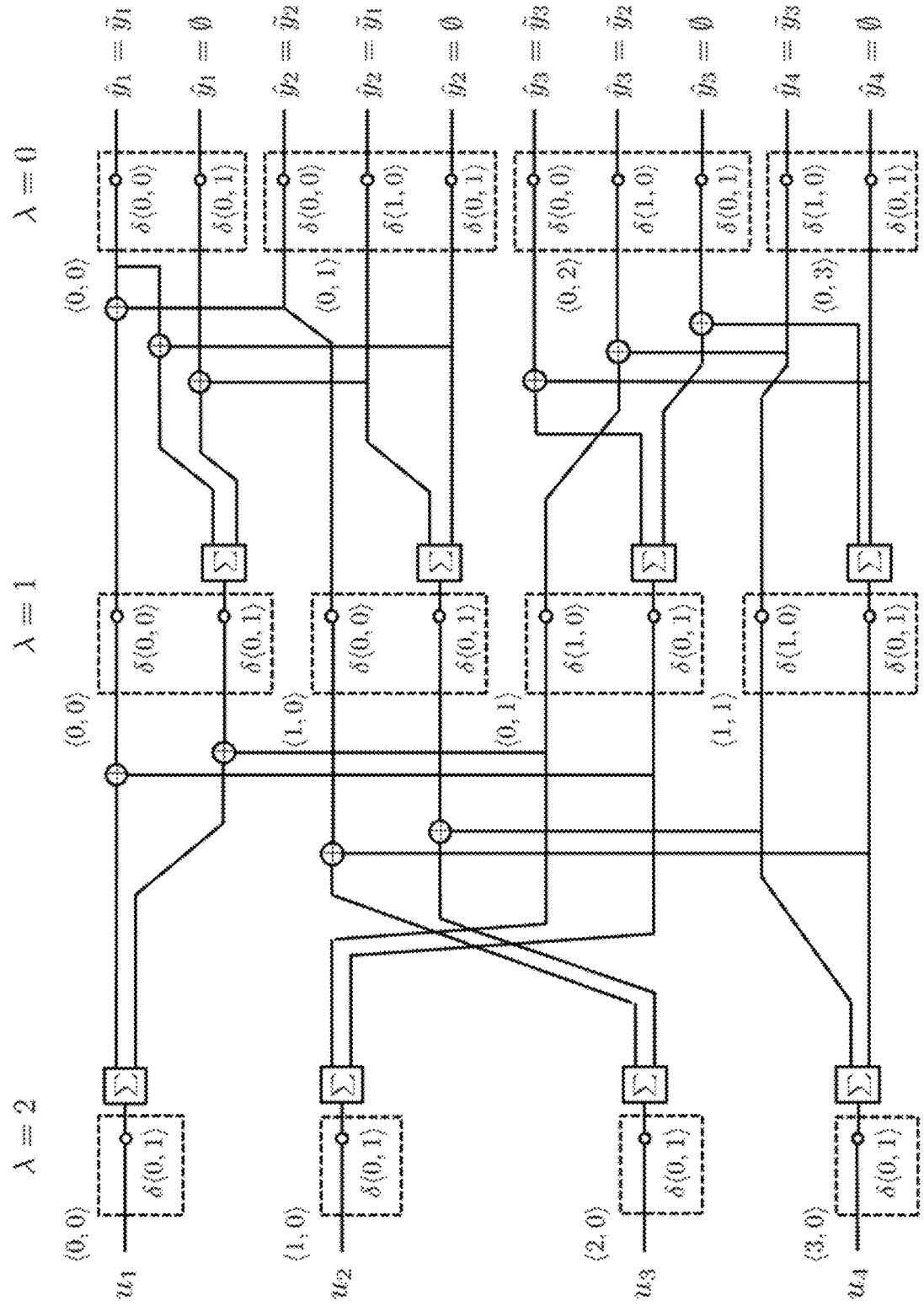
FIG. 5 illustrates an example of a decoding graph of a length-4 polar code with d=1 deleted symbol, in accordance with some embodiments of the presently disclosed technology.

In other words, the original nodes in the polar computation graph are replaced with multiple copies for decoding purposes, where each replacement addresses a different set of mappings from the received symbols to its corresponding output span. FIG. 5 illustrates an example of the modified decoding graph for a polar code of length 4 in presence of 1 deletion error. A node that was originally labeled with $\langle \varphi, \beta \rangle_\lambda$ is now replaced with a group of nodes each labeled with $\delta \langle d_0, d_1 \rangle$, wherein $d_0$ and $d_1$ denote the number of deletions prior and inside the output span of the original $\langle \varphi, \beta \rangle_\lambda$ node. As discussed previously, replacing each node with the group of nodes enables the successive cancellation decoding implementation to reduce the overall computational complexity by not considering all the mappings, but rather using the frozen bits to determine the correct mapping as each step of the recursive successive cancellation decoding implementation is traversed.

In another example, a length-N codeword (denoted $x_0^{N-1}$) is received through a deletion channel, and for a node in the polar computation graph (e.g., a node in FIGS. 3-5), it is assumed that the coded bits corresponding to this node are $x_a^b$, where b−a≥d. When d coded bits are deleted, there are at most $(d+1)(d+2)/2$ mapping rules between $x_a^b$ and the received symbols. Each mapping rule is termed as a scenario.

Figures 6A, 6B:
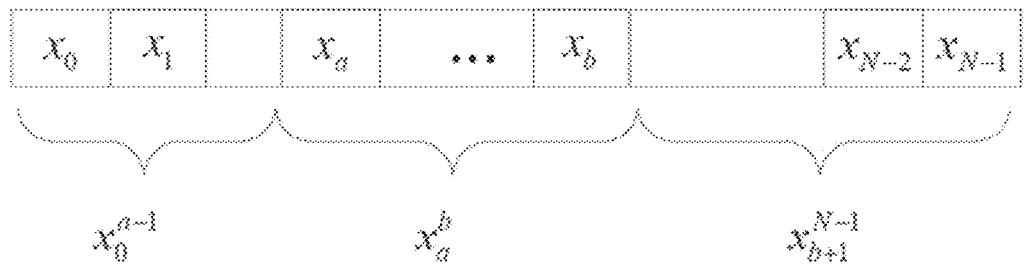
FIG. 6A shows an example of partitioning a length-N codeword into three segments for successive cancellation decoding of a polar code in a deletion channel.
FIG. 6B shows an example of all possible deletion scenarios for the length-N codeword received through a deletion channel.

Continuing with this example, the received length-N codeword is first split into three parts, as illustrated in FIG. 6A. As shown therein, $x_0^{N-1}=(x_0^{a-1}, x_a^b, x_{b+1}^{N-1})$ and it is assumed that $d_1$, $d_2$ and $d_3$ are the number of deleted symbols among the segments $x_0^{a-1}$, $x_a^b$, and $x_{b+1}^{N-1}$, respectively. This implies $$d_1+d_2 \leq d_1+d_2+d_3=d.$$

All possible scenarios are listed in the table shown in FIG. 6B. To label each of these scenarios, $d_2$ is first fixed, and all possible values for $d_1$ are traversed. Then, $d_2$ is changed, and all the possible values of $d_1$ are traversed again. Based on this enumeration, the number of scenario is $(d+1)(d+2)/2$. In other words, at each node, only (i) the number of deletions in an interval and (ii) the number of deletions before that interval need to be tracked. Thus, in an example, the received length-N codeword may be split into two parts (which is equivalent to the number of deletions in the first part or the third part being zero).

In some embodiments, the successive cancellation decoding framework described in this document can be mathematically represented as Equations (1) and (2), which capture the recursive construction of layers of the polar bit-channels (e.g., the layer of the bit-channel illustrated in FIG. 4) in a successive cancellation decoder in the presence of deletion and/or insertion errors.

$$W_\lambda^{(2\psi+1)}(\tilde{y}_1^{n-d} \backslash \langle d_0, d_1, \beta, \lambda \rangle, u_1^{2\psi} | u_{2\psi+1}) = \frac{1}{\binom{\Lambda}{d_1}} \sum_{t=0}^{d_1} \binom{\frac{\Lambda}{2}}{t} \binom{\frac{\Lambda}{2}}{d_1-t} \times \underbrace{\phantom{XXXX}}_{WA}$$

branch $\beta$ $$\left\{ \frac{1}{2} \sum_{u_{2\psi+2}} \underbrace{W_{\frac{\Lambda}{2}}^{(\psi+1)}(\tilde{y}_1^{n-d} \setminus \langle d_0, t, 2\beta, \lambda-1 \rangle, u_{1,even}^{2\psi} \oplus u_{1,odd}^{2\psi} | u_{2\psi+1} + u_{2\psi+2})}_{\text{branch } 2\beta} \right.$$

$$\left. \underbrace{W_{\frac{\Lambda}{2}}^{(\psi+1)}(\tilde{y}_1^{n-d} \setminus \langle d_0, +t, d_1-t, 2\beta+1, \lambda-1 \rangle, u_{1,even}^{2\psi} | u_{2\psi+1})}_{\text{branch } 2\beta+1} \right\}$$

Equation (1)

$$\underbrace{W_{\Lambda}^{(2\psi+2)}(\tilde{y}_1^{n-d} \setminus \langle d_0, d_1, \beta, \lambda \rangle, u_1^{2\psi+1} | u_{2\psi+1})}_{\text{branch } \beta} =$$

$$\underbrace{\frac{1}{\binom{\Lambda}{d_1}} \sum_{t=0}^{d_1} \binom{\frac{\Lambda}{2}}{t} \binom{\frac{\Lambda}{2}}{d_1-t}}_{WA} \times$$

$$\left\{ \underbrace{\frac{1}{2} W_{\frac{\Lambda}{2}}^{(\psi+1)}(\tilde{y}_1^{n-d} \setminus \langle d_0, t, 2\beta, \lambda-1 \rangle, u_{1,even}^{2\psi} \oplus u_{1,odd}^{2\psi} | u_{2\psi+1} + u_{2\psi+2})}_{\text{branch } 2\beta} \right.$$

$$\left. \underbrace{W_{\frac{\Lambda}{2}}^{(\psi+1)}(\tilde{y}_1^{n-d} \setminus \langle d_0+t, d_1-t, 2\beta+1, \lambda-1 \rangle, u_{1,even}^{2\psi} | u_{2\psi+1})}_{\text{branch } 2\beta+1} \right\}$$

Equation (2)

Figure 2:
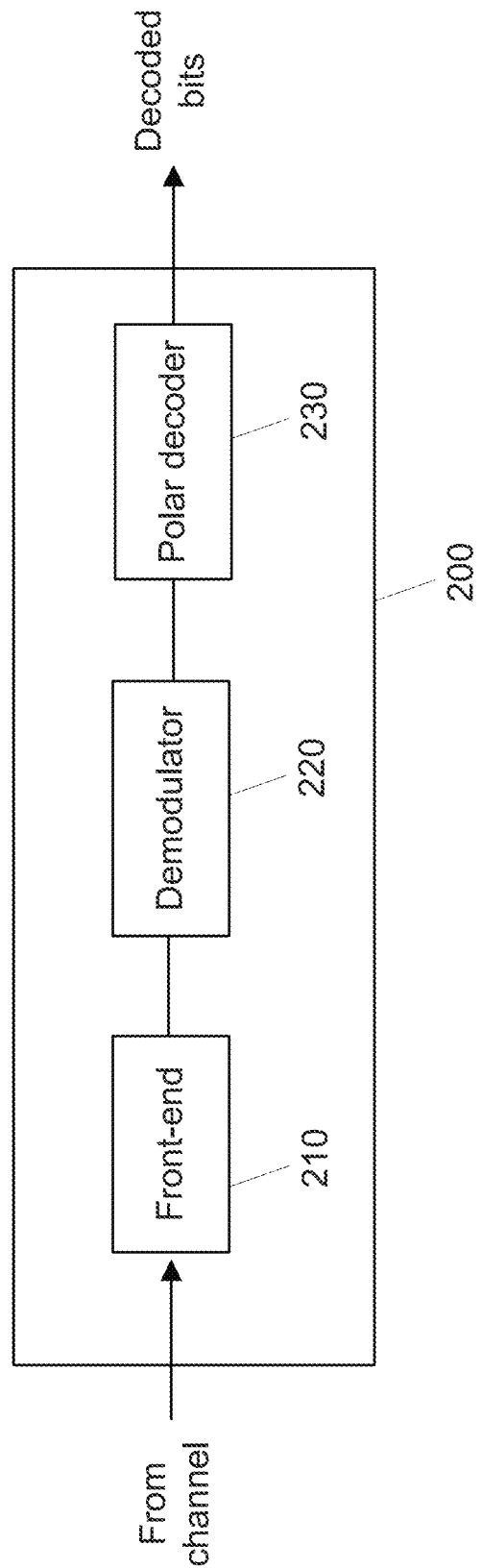
FIG. 2 is a block diagram of an exemplary receiver with a polar decoder.

As described in the context of FIGS. 2-4, each processing node within the polar computation graph can be represented by four parameters—a phase number ($\varphi$), a branch number ($\beta$), a layer number ($\lambda$) and a state number (denoted by, e.g., $\langle d_0, d_1 \rangle$). In some embodiments, each processing node is further configured to store and forward soft information about its bit value. For example, the soft information can be represented by a pair of probabilities, a likelihood ratio, or the logarithm of the likelihood ratio (LLR).

In some embodiments, each processed node is connected to a sub-vector (or sub string) of polar-coded symbols, which is defined as a subset of consecutively indexed polar coded symbols. The state (e.g.) of the processing node determines the start ($d_0$) and end ($d_1$) of the sub string connected to that processing node, or equivalently, the number of insertion and/or deletion errors that occurred before and within the sub string.

For example, Equation (1) represents a branch $\beta$ at a layer [lambda] as the product of a first branch $2\beta$ and a second branch $2\beta+1$, wherein the first and second branches are in the previous layer $\lambda-1$. This corresponds to the processing node $\langle \varphi, \beta \rangle_\lambda$ combining the soft information from the nodes in the immediately lower layer (at $\langle \varphi, 2\beta \rangle_{\lambda-1}$ and $\langle \varphi, 2\beta+1 \rangle_{\lambda-1}$). For example, the soft information is combined using a weighted average (the sum and combinatorial terms denoted "WA" in Equation (1)) that accounts for the various combinations of $d_0$ and $d_1$ deletion or insertion error that occurred before and within the substring of polar coded symbols associated with the node whose being processed at that stage, respectively.

In some embodiments, the successive cancellation decoding of polar codes over the modified polar computation graph is performed by a predetermined schedule of soft-information updates.

Figure 7:
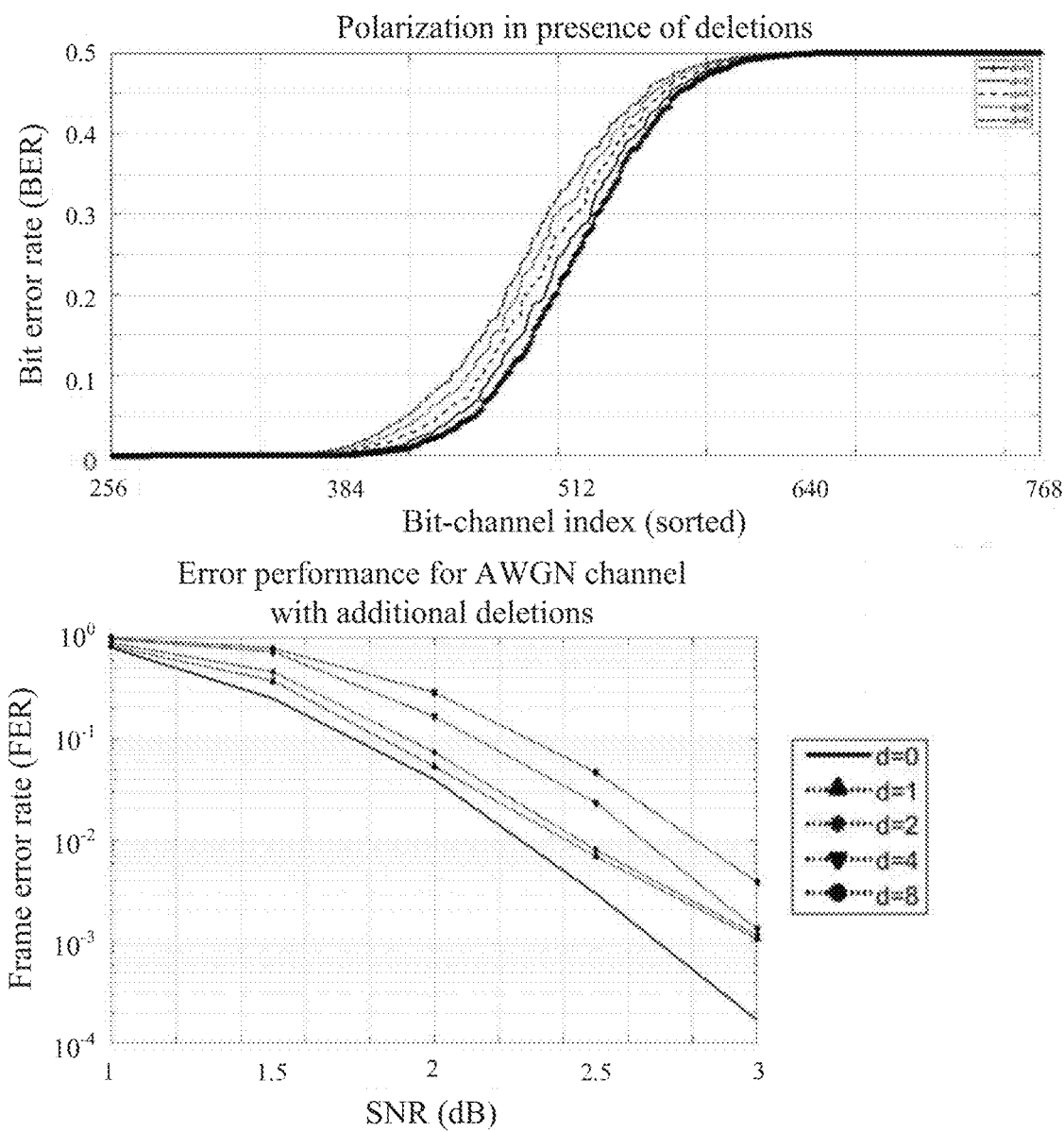
FIG. 7 illustrates the performance of an exemplary polar code in a deletion channel, in accordance with some embodiments of the presently disclosed technology.

FIG. 7 illustrates the performance of an exemplary polar code in a deletion channel, for different number of deletions (e.g., d=0, 1, 2, 4, 6, 8). The top figure depicts the error probability of polar bit-channels for a polar code of length n=1024 and with a binary erasure channel (BEC) with probability ½. It is noted that the top figure only depicts the middle half of the polarized bit-channels upon them being sorted. The lower figure in FIG. 7 shows the frame error rate of a rate-½ polar code with length n=2048 for an AWGN channel with deletions.

Figure 8:
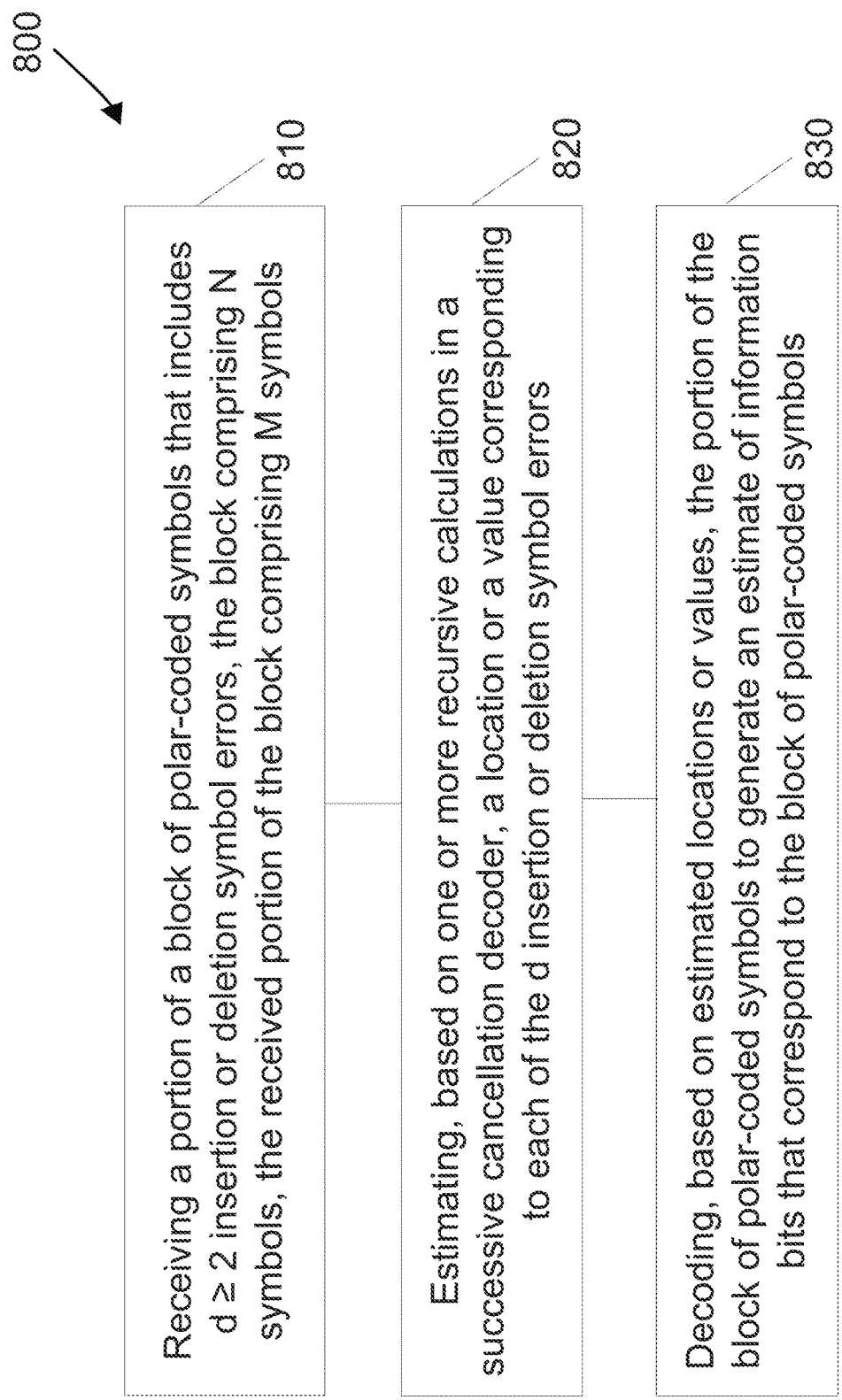
FIG. 8 illustrates a flowchart of an exemplary method for using polar codes in a deletion channel, in accordance with some embodiments of the presently disclosed technology.

FIG. 8 illustrates a flowchart of an exemplary method 800 for using polar codes in a deletion and/or insertion channel. The method 800 includes, at operation 810, receiving a portion of a block of polar-coded symbols that includes d≥2 insertion or deletion symbol errors, the block comprising N symbols, the received portion of the block comprising M symbols, wherein d, M and N are integers.

The method 800 includes, at operation 820, estimating, based on one or more recursive calculations in a successive cancellation decoder, a location or a value corresponding to each of the d insertion or deletion symbol errors.

The method 800 includes, at operation 830, decoding, based on estimated locations or values, the portion of the block of polar-coded symbols to generate an estimate of information bits that correspond to the block of polar-coded symbols.

In some embodiments, the successive cancellation decoder comprises at least log 2(N)+1 layers, each layer comprising up to d2N processing nodes arranged as N groups, each of the N groups comprising up to d2 processing nodes.

In some embodiments, a complexity of estimating the location or the value scales polynomially with d.

In some embodiments, at least one bit of the information bits has a known value at the data processing system prior to receiving the portion of the block of polar-coded symbols.

In some embodiments, the d insertion or deletion symbol errors comprise (a) two or more deleted symbols, (b) two or more inserted symbols, or (c) at least one deleted symbol and at least one inserted symbol.

In some embodiments, and with references to FIGS. 3 and 4, the up to $d^2$ processing nodes have replaced a corresponding one of N processing nodes of a conventional successive cancellation decoder.

In some embodiments, generating the estimate of the information bits excludes using a combinatorial search of the d insertion or deletion symbol errors. For example, the combinatorial search has a complexity governed by $\mathcal{O}(N^{d+1} \log N)$, and wherein the complexity of generating the estimate is governed by $\mathcal{O}(d^3 N \log N)$.

In some embodiments, generating the estimate is based on a polar computation graph structure. In an example, a node of the polar computation graph corresponds to a sub string of symbols in the block of polar-coded symbols and is characterized by a phase number, a branch number, a layer number of the at least $\log_2(N)+1$ layers, and a state number. In another example, the nodes in a first layer of the at least $\log_2(N)+1$ layers are initialized based on a corresponding channel observation for a symbol associated with the nodes.

In some embodiments, the block of polar-coded symbols correspond to the information bits encoded using a polar code generator matrix having N rows and N columns. For example, $$G_2 = \begin{bmatrix} 1 & 0 \\ 1 & 1 \end{bmatrix}$$

is a polarizing matrix, wherein the polar code generator matrix is $G_N = G_2^{\otimes n}$ which is an n-th Kronecker power of the polarizing matrix.

In some embodiments, each group of up to $d^2$ processing nodes corresponds to a sub string of the block of polar-coded symbols. In an example, a number of processing nodes within each group is based on a number of deletion-type errors occurring before and after the corresponding sub string of the block of polar-coded symbols.

Figure 9:
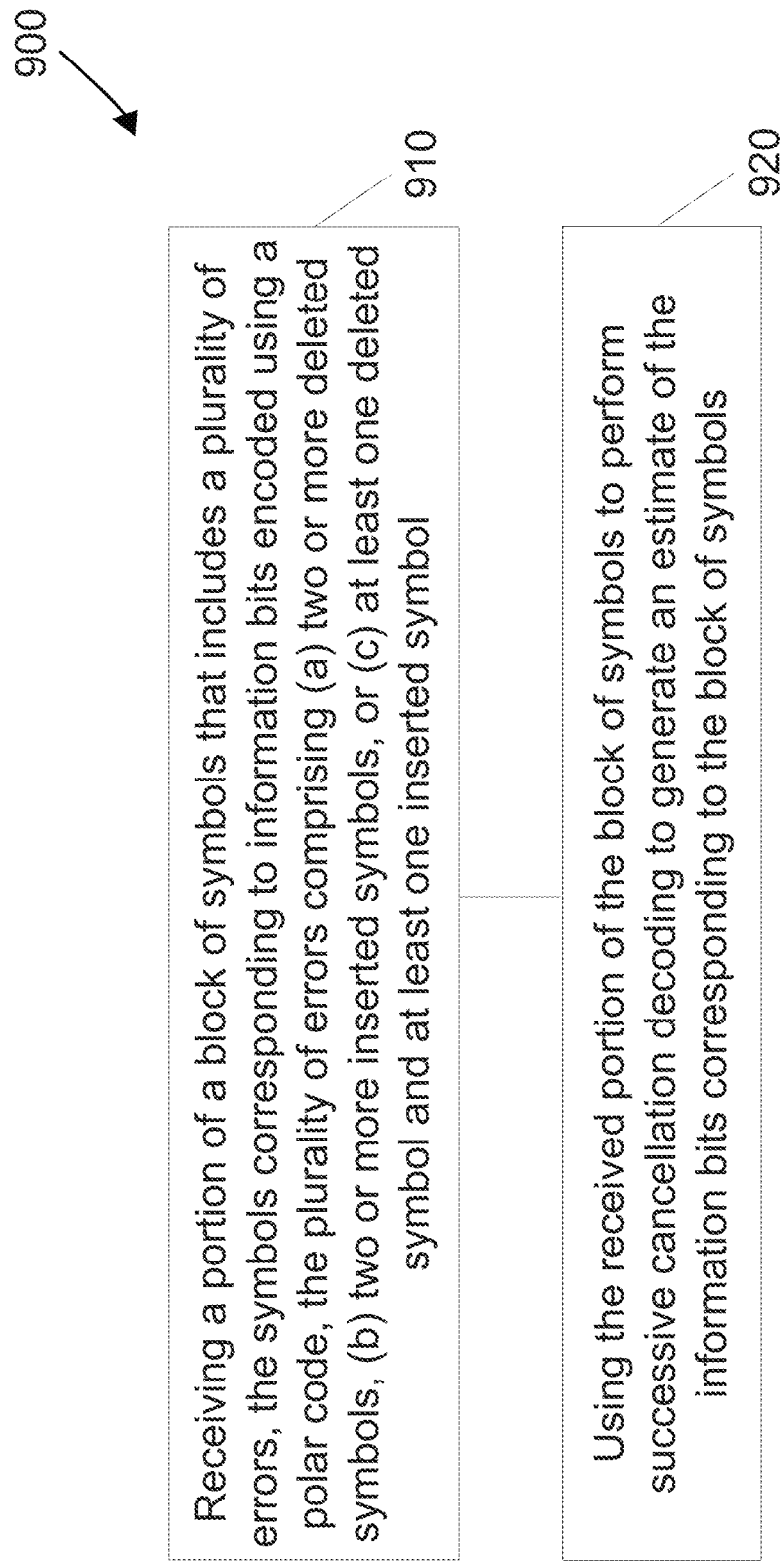
FIG. 9 illustrates a flowchart of another exemplary method for using polar codes in a deletion channel, in accordance with some embodiments of the presently disclosed technology.

FIG. 9 illustrates a flowchart of another exemplary method 900 for using polar codes in a deletion and/or insertion channel. The method 900 includes, at operation 910, receiving a portion of a block of symbols that includes a plurality of errors, the symbols corresponding to information bits encoded using a polar code, the plurality of errors comprising (a) two or more deleted symbols, (b) two or more inserted symbols, or (c) at least one deleted symbol and at least one inserted symbol, the block comprising N symbols and the received portion of the block comprising M symbols, and M and N being integers.

The method 900 includes, at operation 920, using the received portion of the block of symbols to perform successive cancellation decoding to generate an estimate of the information bits corresponding to the block of symbols.

In some embodiments, at least one bit of the information bits has a known value at the data processing system prior to receiving the portion of the block of polar-coded symbols.

In some embodiments, a complexity of generating the estimate scales polynomially with a number of the plurality of errors and a number of symbols in the block (N).

Embodiments of the disclosed technology can be applied in any communication system affected by synchronization errors, such as insertions and deletions. Since the disclosed technology for correcting such errors is based on polar coding, the described embodiments are particularly attractive in systems that already use polar coding. Additionally, the disclosed embodiments boost the value of polar coding for use in future systems that can benefit from correcting "conventional" errors (e.g., caused by noise) and synchronization errors using the same coding technique.

In the context of wireless communication systems, the described embodiments can advantageously improve communication technology. In this context, many services running on modern digital telecommunications networks require accurate synchronization for correct operation. For example, if switches do not operate with the same clock rates, then slips will occur and degrade performance. Embodiments of the disclosed technology significantly reduce the complexity required for synchronization, thereby enabling higher data rates and more resilient communications between wireless devices, which in turn can be used to provide higher quality voice, video, data, or other types of information in wired and/or wireless communication systems, thereby improving the area of communication technology.

Additionally, the described embodiments can advantageously improve networked and storage systems. In this context, synchronization algorithms find numerous areas of use, including data storage, file sharing, source code control systems, and cloud applications. For example, cloud storage services such as Dropbox synchronize between local copies and cloud backups each time users make changes to local versions. For example, two nodes (servers) may have copies of the same file but one is obtained from the other over a noiseless (or noisy) link that is affected by deletions. Thus, a file obtained from one of the servers by the other server may have d bits missing, and which may be corrected using embodiments of the disclosed technology. This improves the resiliency of redundant storage systems, cloud-based services and applications, and so on. Additional applications of the disclosed technology include implementations in mobile devices, such as unmanned aerial devices (UAVs), and autonomous vehicles, as well as smartphones and portable computing devices, which can benefit from the improved error correction capabilities of the disclosed embodiments that result in better quality of communications, as well as a reduction in cost, weight, and/or energy consumption of the components.

FIG. 10 is a block diagram representation of a portion of an apparatus, in accordance with some embodiments of the presently disclosed technology. An apparatus 1005, such as a base station or a wireless device (or UE), can include processor electronics 1010 such as a microprocessor that implements one or more of the techniques (including, but not limited to, methods 800 and 900) presented in this document. The apparatus 1005 can include transceiver electronics 1015 to send and/or receive wireless signals over one or more communication interfaces such as antenna(s) 1020. The apparatus 1005 can include other communication interfaces for transmitting and receiving data. Apparatus 1005 can include one or more memories (not explicitly shown) configured to store information such as data and/or instructions. In some implementations, the processor electronics 1010 can include at least a portion of the transceiver electronics 1015. In some embodiments, at least some of the disclosed techniques, modules or functions are implemented using the apparatus 1005.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

It is intended that the specification, together with the drawings, be considered exemplary only, where exemplary means an example. As used herein, the singular forms "a", "an" and "the" are intended to include the plural forms as well, unless the context clearly indicates otherwise. Additionally, the use of "or" is intended to include "and/or", unless the context clearly indicates otherwise.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A data processing system with improved error correction operation, comprising:
   a processor; and
   a non-transitory memory with instructions thereon, wherein the instructions upon execution by the processor cause the processor to:
   receive a portion of a block of polar-coded symbols that includes d insertion or deletion symbol errors, the block of polar-coded symbols having been provided to a channel that introduces a deletion symbol error or an insertion symbol error prior to reception by the data processing system, the deletion symbol error corresponding to a symbol of the block of polar-coded symbols at a random location being transformed to an empty symbol by the channel, the insertion symbol error corresponding to a symbol being added into the block of polar-coded symbols at another random location with a predefined probability by the channel, the block comprising N symbols, the received portion of the block comprising M symbols, wherein $d \geq 2$, and wherein M and N are integers;
   perform at least one recursive calculation in a successive cancellation decoder to generate an estimate of a location or a value corresponding to each of the d insertion or deletion symbol errors; and
   perform, based on the estimate of the location or the value, a polar decoding operation on the portion of the block of polar-coded symbols to generate an estimate of information bits that correspond to the block of polar-coded symbols,
   wherein the successive cancellation decoder comprises a plurality of layers, each of the plurality of layers comprising up to $d^2N$ processing nodes arranged as N groups, each of the N groups comprising up to $d^2$ processing nodes, wherein estimating the location or the value has a complexity that scales polynomially with d, and wherein at least one bit of the information bits has a known value at the data processing system prior to receiving the portion of the block of polar-coded symbols.

2. The data processing system of claim 1, wherein the d insertion or deletion symbol errors comprise (a) two or more deleted symbols, (b) two or more inserted symbols, or (c) at least one deleted symbol and at least one inserted symbol.

3. The data processing system of claim 1, wherein the up to $d^2$ processing nodes have replaced a corresponding one of N processing nodes of a conventional successive cancellation decoder.

4. The data processing system of claim 1, wherein generating the estimate of the information bits excludes using a combinatorial search of the d insertion or deletion symbol errors.

5. The data processing system of claim 4, wherein the combinatorial search has a complexity governed by $\mathcal{O}(N^{d+1} \log N)$, and wherein the complexity of generating the estimate is governed by $\mathcal{O}(d^3 N \log N)$.

6. The data processing system of claim 1, wherein generating the estimate of the information bits is based on a polar computation graph.

7. The data processing system of claim 6, wherein a node of the polar computation graph corresponds to a substring of symbols in the block of polar-coded symbols and is characterized by a phase number, a branch number, a layer number of the plurality of layers, and a state number.

8. The data processing system of claim 7, wherein nodes in a first layer of the plurality of layers are initialized based on a corresponding channel observation for a symbol associated with the nodes.

9. The data processing system of claim 1, wherein the block of polar-coded symbols correspond to the information bits encoded using a polar code generator matrix having N rows and N columns.

10. The data processing system of claim 9, wherein $$G_2 = \begin{bmatrix} 1 & 0 \\ 1 & 1 \end{bmatrix}$$

is a polarizing matrix, wherein the polar code generator matrix is $G_N = G_2^{\otimes n}$ which is an n-th Kronecker power of the polarizing matrix.

11. The data processing system of claim 1, wherein each group of up to $d^2$ processing nodes corresponds to a substring of the block of polar-coded symbols.

12. The data processing system of claim 11, where a number of processing nodes within each group is based on a number of deletion-type errors occurring before and after the corresponding substring of the block of polar-coded symbols.

13. A non-transitory computer-readable storage medium having instructions stored thereupon for improved error correction, comprising:

instructions for receiving, at a data processing system, a portion of a block of polar-coded symbols that includes d insertion or deletion symbol errors, the block of polar-coded symbols having been provided to a channel that introduces a deletion symbol error or an insertion symbol error prior to reception by the data processing system, the deletion symbol error corresponding to a symbol of the block of polar-coded symbols at a random location being transformed to an empty symbol by the channel, the insertion symbol error corresponding to a symbol being added into the block of polar-coded symbols at another random location with a predefined probability by the channel, the block comprising N symbols, the received portion of the block comprising M symbols, wherein $d \geq 2$, and wherein M and N are integers;

instructions for performing at least one recursive calculation in a successive cancellation decoder to generate an estimate of a location or a value corresponding to each of the d insertion or deletion symbol errors; and instructions for performing, based on the estimate of the location or the value, a polar decoding operation on the portion of the block of polar-coded symbols to generate an estimate of information bits that correspond to the block of polar-coded symbols, wherein the successive cancellation decoder comprises a plurality of layers, each of the plurality of layers comprising up to $d^2N$ processing nodes arranged as N groups, each of the N groups comprising up to $d^2$ processing nodes, wherein estimating the location or the value has a complexity that scales polynomially with d, and wherein at least one bit of the information bits has a known value at the data processing system prior to receiving the portion of the block of polar-coded symbols.

14. The non-transitory computer-readable storage medium of claim 13, wherein the up to $d^2$ processing nodes have replaced a corresponding one of N processing nodes of a conventional successive cancellation decoder.

15. The non-transitory computer-readable storage medium of claim 13, wherein generating the estimate of the information bits excludes using a combinatorial search of the d insertion or deletion symbol errors.

16. The non-transitory computer-readable storage medium of claim 15, wherein the combinatorial search has a complexity governed by $\mathcal{O}(N^{d+1} \log N)$, and wherein the complexity of generating the estimate is governed by $\mathcal{O}(d^3 N \log N)$.

17. A method for improved error correction, comprising:

receiving, at a data processing system, a portion of a block of polar-coded symbols that includes d insertion or deletion symbol errors, the block of polar-coded symbols having been provided to a channel that introduces a deletion symbol error or an insertion symbol error prior to reception by the data processing system, the deletion symbol error corresponding to a symbol of the block of polar-coded symbols at a random location being transformed to an empty symbol by the channel, the insertion symbol error corresponding to a symbol being added into the block of polar-coded symbols at another random location with a predefined probability by the channel, the block comprising N symbols, the received portion of the block comprising M symbols, wherein $d \geq 2$, and wherein M and N are integers;

performing at least one recursive calculation in a successive cancellation decoder to generate an estimate of a location or a value corresponding to each of the d insertion or deletion symbol errors; and performing, based on the estimate of the location or the value, a polar decoding operation on the portion of the block of polar-coded symbols to generate an estimate of information bits that correspond to the block of polar-coded symbols, wherein the successive cancellation decoder comprises a plurality of layers, each of the plurality of layers comprising up to $d^2 N$ processing nodes arranged as N groups, each of the N groups comprising up to $d^2$ processing nodes, wherein estimating the location or the value has a complexity that-scales polynomially with d, and wherein at least one bit of the information bits has a known value at the data processing system prior to receiving the portion of the block of polar-coded symbols.

18. The method of claim 17, wherein the up to $d^2$ processing nodes have replaced a corresponding one of N processing nodes of a conventional successive cancellation decoder.

19. The method of claim 17, wherein generating the estimate of the information bits excludes using a combinatorial search of the d insertion or deletion symbol errors.

20. The method of claim 19, wherein the combinatorial search has a complexity governed by $\mathcal{O}(N^{d+1} \log N)$, and wherein the complexity of generating the estimate is governed by $\mathcal{O}(d^3 N \log N)$.

* * * * *